(12) United States Patent
Jeon et al.

(10) Patent No.: US 12,438,542 B2
(45) Date of Patent: Oct. 7, 2025

(54) WIDE FREQUENCY RANGE HIGH SPEED CLOCK MULTIPLEXER

(71) Applicant: Avago Technologies International Sales Pte. Limited, Singapore (SG)

(72) Inventors: Hyung-Joon Jeon, Irvine, CA (US); Jun Cao, Irvine, CA (US); Seong Ho Lee, Aliso Viejo, CA (US); Anand J Vasani, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 49 days.

(21) Appl. No.: 18/141,344

(22) Filed: Apr. 28, 2023

(65) Prior Publication Data
US 2024/0364334 A1    Oct. 31, 2024

(51) Int. Cl.
*H03K 17/693* (2006.01)
(52) U.S. Cl.
CPC .................................. *H03K 17/693* (2013.01)
(58) Field of Classification Search
None
See application file for complete search history.

(56) References Cited

U.S. PATENT DOCUMENTS

| | | | | |
|---|---|---|---|---|
| 8,729,975 B2 * | 5/2014 | Van Goor | ............ | G06F 30/396 331/167 |
| 8,791,742 B2 * | 7/2014 | Garg | ......................... | G06F 1/10 327/299 |
| 11,967,395 B2 * | 4/2024 | Hsiao | ....................... | G11C 7/22 |
| 2008/0012600 A1 | 1/2008 | Hairapetian | | |
| 2022/0171718 A1 | 6/2022 | Kundu et al. | | |

OTHER PUBLICATIONS

Foreign Search Report on non-Foley case related to U.S. Appl. No. 18/141,344 Dtd Sep. 26, 2024.
Yuan F: "Fully differential 8-to-1 current-mode multiplexer for 10 Gbit/s serial links in 0.18 m CMOS", Electronics Letters, the Institution of Engineering and Technology, GB, vol. 40, No. 13, Jun. 24, 2004 (Jun. 24, 2004) , pp. 789-790, XP006022185, ISSN: 0013?5194, DOI: 10.1049/EL:20040538 * figure 2 *.

* cited by examiner

*Primary Examiner* — Jeffrey S Zweizig
(74) *Attorney, Agent, or Firm* — Foley & Lardner LLP

(57) ABSTRACT

In some implementations, the device may include a first circuit receiving an input signal having a first frequency, the first circuit including a first node and a second node. The device may include a second circuit receiving an input signal having a second frequency different from the first frequency, the second circuit including a first node and a second node, a first inductor coupled between the first node of the first circuit and the first node of the second circuit. The device may include a second inductor coupled between the second node of the first circuit and the second node of the second circuit, a first switch coupled between the first node of the second circuit and the second node of the second circuit, at least one differential inductor formed of the first inductor and the second inductor in response to the first switch being in a closed state.

17 Claims, 9 Drawing Sheets

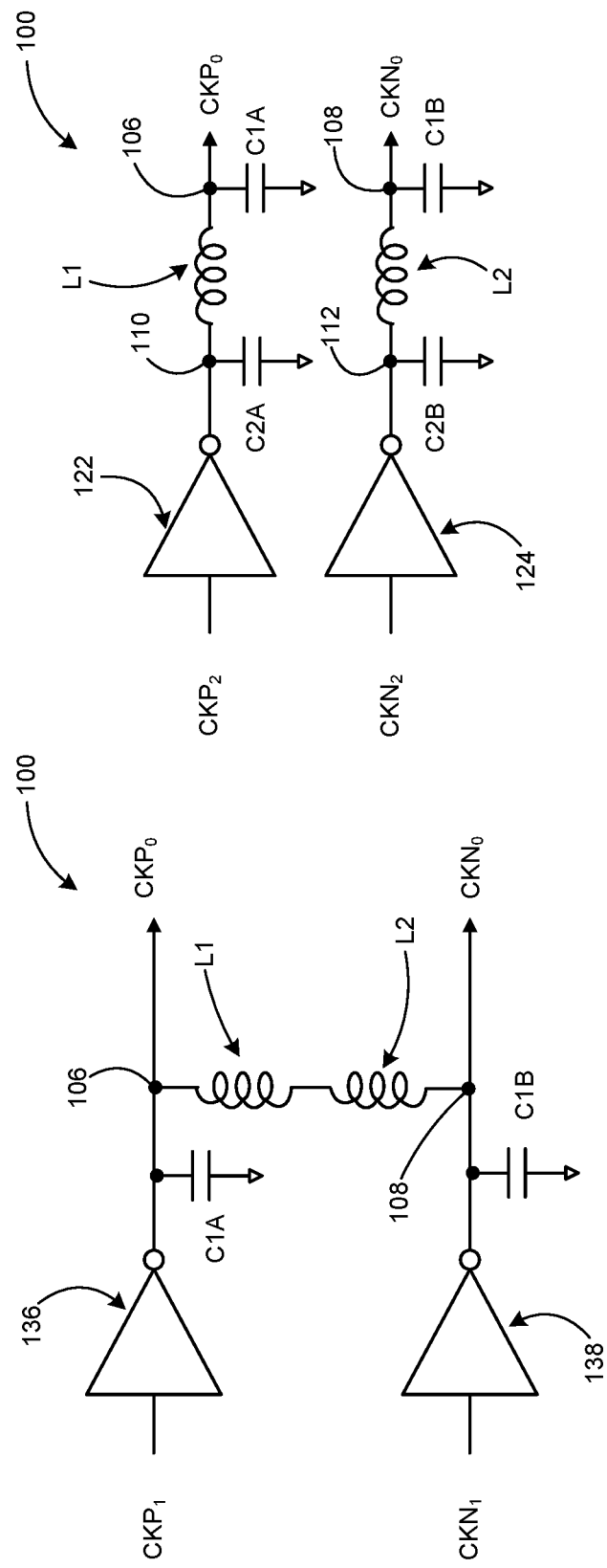

WIDE FREQUENCY RANGE HIGH SPEED CLOCK MULTIPLEXER

BACKGROUND

The present disclosure relates generally to the field of transceivers, and more specifically to high-speed transceivers. The high-speed transceivers cover multiple data rates to support backward compatibility and various standards. The transceiver scales clock frequency accordingly to optimize power efficiency. The clock multiplexer changes clock frequency by switching between two or more clock paths.

SUMMARY OF THE INVENTION

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In one general aspect, a device receiving an input signal and providing an output signal is provided, where the device may include a first circuit receiving an input signal having a first frequency, the first circuit including a first node and a second node. In some embodiments, the device may also include a second circuit receiving an input signal having a second frequency different from the first frequency, the second circuit including a first node and a second node. In some embodiments, the device may furthermore include a first inductor coupled between the first node of the first circuit and the first node of the second circuit. In some embodiments, the device may include a second inductor coupled between the second node of the first circuit and the second node of the second circuit. Other embodiments of this aspect include corresponding computer systems, apparatus, and computer programs recorded on one or more computer storage devices, each configured to perform the actions of the methods.

Implementations may include one or more of the following features. In some embodiments, the device may include a first switch coupled between the first node of the second circuit and the second node of the second circuit. In some embodiments, the device may include at least one differential inductor formed of the first inductor and the second inductor in response to the first switch being in a closed state, where the device outputs a resonant clock signal. In some embodiments, the device may include the first circuit transmitting a signal corresponding to an input signal received by the first circuit to an output of the device in response to the first switch being in a closed state, where the device outputs a resonant clock signal. In some embodiments, the device may include the first inductor being decoupled from the second inductor in response to the first switch being in an open state, where the device outputs a CMOS clock signal. In some embodiments, the device may include the first inductor being in series with at least partial capacitance of the first circuit and at least partial capacitance of the second circuit in response to the first switch being in an open state; and the second inductor being in series with at least partial capacitance of the first circuit and at least partial capacitance of the second circuit in response to the first switch being in the open state, where the device outputs the CMOS clock signal. In some embodiments, the device may include the second circuit transmitting a signal corresponding to an input signal received by the second circuit to an output of the device in response to the first switch being in an open state, where the device outputs a CMOS clock signal. In some embodiments, the device may include the first frequency being higher than the second frequency. In some embodiments, the device may include the first frequency being higher than the second frequency at least by a factor of two. In some embodiments, the device can be configured to be programmable by a user to set at least one of the first frequency and the second frequency. Implementations of the described techniques may include hardware, a method or process, or a computer tangible medium.

In one general aspect, system receiving an input signal and providing an output signal is provided, where the system may include one or more processors of a device, the one or more processors configured to receive, by a first circuit, an input signal having a first frequency, the first circuit including a first node and a second node. In some embodiments, the system may furthermore include receive, by a second circuit, an input signal having a second frequency different from the first frequency, the second circuit including a first node and a second node. System may in addition include output, by the device, an output signal corresponding to the first frequency or the second frequency. In some embodiments, the system may include where a first inductor is coupled between the first node of the first circuit and the first node of the second circuit. In some embodiments, the system may also include where a second inductor is coupled between the second node of the first circuit and the second node of the second circuit. Other embodiments of this aspect include corresponding computer systems, apparatus, and computer programs recorded on one or more computer storage devices, each configured to perform the actions of the methods.

Other embodiments may include one or more of the following features. In some embodiments, the system may include the one or more processors further configured to operate a first switch coupled between the first node of the second circuit and the second node of the second circuit. In some embodiments, the system may include the one or more processors further configured to form at least one differential inductor of the first inductor and the second inductor in response to the first switch being in a closed state, where the system outputs a resonant clock signal. In some embodiments, the system may include the one or more processors further configured to receive, by the first circuit, an input signal, and transmit, by the first circuit a signal corresponding to the input signal to an output of the device in response to the first switch being in a closed state, where the system outputs a resonant clock signal. In some embodiments, the system may include the one or more processors further configured to decouple the first inductor from the second inductor in response to the first switch being in an open state, where the system outputs a CMOS clock signal. In some embodiments, the system may include the one or more processors further configured to couple in series the first inductor with at least partial capacitance of the first circuit and at least partial capacitance of the second circuit in response to the first switch being in an open state, and couple in series the second inductor with at least partial capacitance of the first circuit and at least partial capacitance of the second circuit in response to the first switch being in the open state, where the system outputs the CMOS clock signal. In some embodiments, the system may include the one or more processors further configured to receive, by the second circuit, an input signal, transmit, by the second circuit, a signal corresponding to the input signal to an output of the device in response to the first switch being in an open state, where the system outputs the CMOS clock signal. In some embodiments, the system may include the one or more processors further configured to be programmable by a user setting at least one of the first frequency or the second frequency.

In one general aspect, a method to operate a device may include receiving, by a first circuit, an input signal having a first frequency, the first circuit including a first node and a second node. In some embodiments, the method may also include receiving, by a second circuit, an input signal having a second frequency different from the first frequency, the second circuit including a first node and a second node. In some embodiments, the method may include outputting, by the device, an output signal corresponding to the first frequency or the second frequency. In some embodiments, the method may include operating the device where a first inductor is coupled between the first node of the first circuit and the first node of the second circuit. In some embodiments, the method may include operating the device where a second inductor is coupled between the second node of the first circuit and the second node of the second circuit.

In one general aspect, a method to operate the device may include operating a first switch coupled between the first node of the second circuit and the second node of the second circuit. Implementations of the described techniques may include hardware, a method or process, or a computer tangible medium. Other embodiments of this aspect include corresponding computer systems, apparatus, and computer programs recorded on one or more computer storage devices, each configured to perform the actions of the methods.

BRIEF DESCRIPTION OF THE DRAWINGS

FIG. 3B is a schematic diagram of a hybrid clock multiplexer having a resonant clocking architecture for a high-speed path, according to one or more embodiments;

FIG. 3C is a schematic diagram of a hybrid clock multiplexer having CMOS clocking for a low-speed path, according to one or more embodiments;

DETAILED DESCRIPTION

Figure 1A:
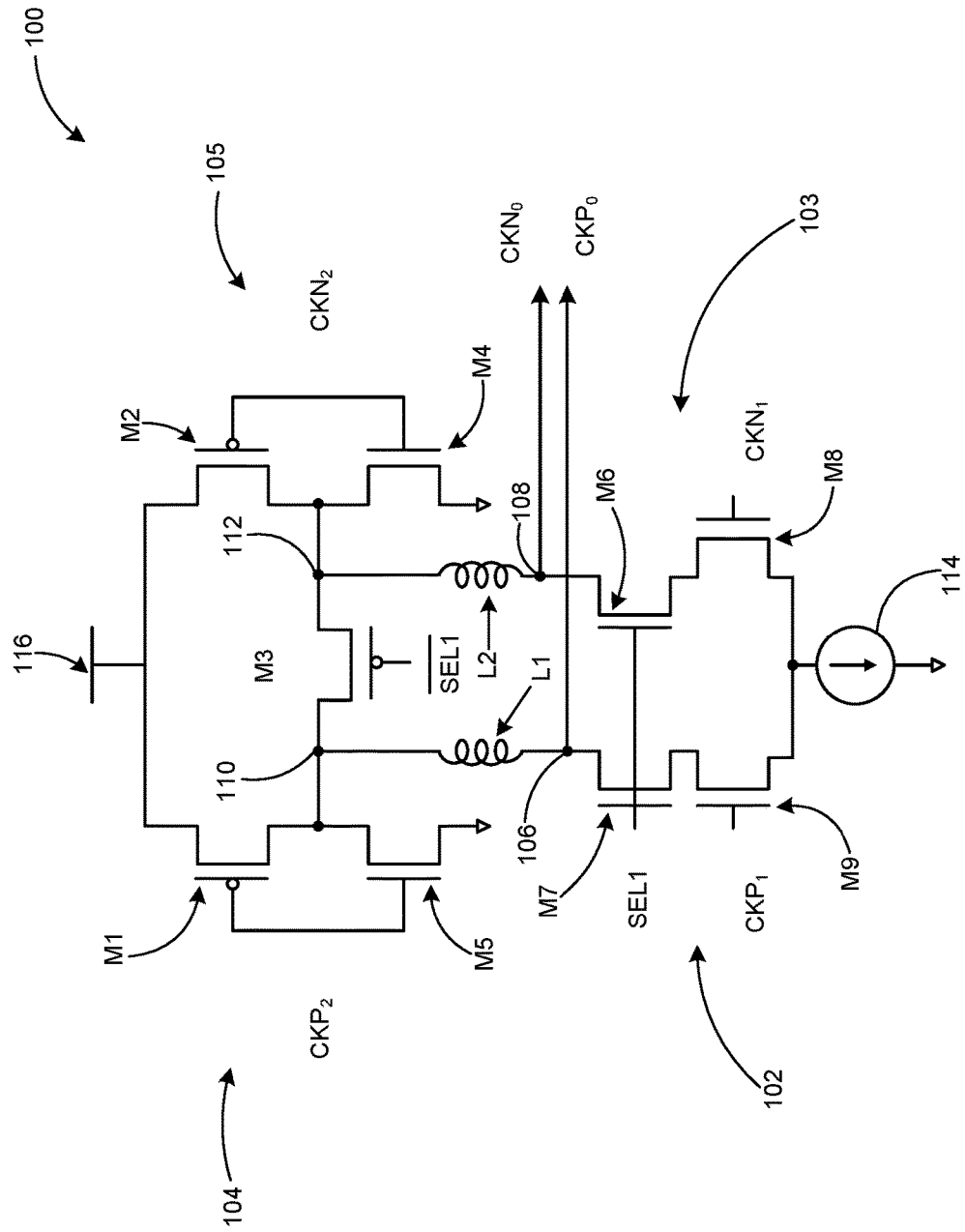
FIG. 1A is a schematic diagram of a hybrid clock multiplexer, according to one or more embodiments.

In a foreseeable future, a maximum frequency requirement for a clock multiplexer continues to increase. At the same time, minimum frequency requirement may not increase due to backward compatibility and an industry requirement to support multiple standards. For example, the maximum clock frequency can exceed 20 GHz for transceivers having a speed exceeding 100 Gbps.

A resonant clocking can multiplex high clock frequencies to meet strict jitter specification and power efficiency. The high frequency in microelectronics, semiconductor manufacturing, or the like industry can be, for example, in a range between 20 GHz and 300 GHz. A Complementary Metal-Oxide-Semiconductor (CMOS) clocking can multiplex low frequencies to achieve adequate power, performance, and area efficiency. The low frequency in microelectronics, semiconductor manufacturing or the like industry can be, for example, in a range between 300 Hz and 20 GHz. A threshold between the low frequency and high frequency can depend on development of a CMOS technology and in some devices, can be 30 GHz or 40 GHz. Put another way, when the CMOS devices are further developed, the low frequency range can change to become, e.g., between 300 Hz and 30 GHz or between 300 Hz and 40 GHz, the high frequency range can change to become, e.g., between 30 GHz and 300 GHz or between 40 GHz and 300 GHz. Typically, it is difficult to combine the regular multiplex resonant and the CMOS clocking techniques in one device. A user often needs to choose one type of clocking architecture (e.g., the resonant or CMOS clocking) for all clock paths of the conventional multiplexer.

A more detailed reference is now made to the typical CMOS clocking. Implementation of a conventional CMOS device can be compact and include a plurality of transmission gate switches. For example, the first and second input clock signals can be connected to the gate electrodes of first and second transmission gates, respectively. The output of the first and second transmission gates can be connected in parallel to the inputs of the first and second inverters, respectively. The output of the two inverters can be coupled together to form the output clock signal CKo.

For example, when a control signal SEL1 is high and the opposite control signal /SEL1 is low (that can be at the same time when a corresponding signal SEL2 is low and /SEL2 or $\overline{SEL2}$ is high), SEL1 is turned on and SEL2 is turned off, allowing first input clock signal to pass through to the first inverter and blocking the second input clock signal by SEL2. The first inverter inverts the signal and outputs it to the output node, while the second inverter does not affect the output signal since SEL2 is turned off.

When SEL2 is high and /SEL2 is low (that can be at the same time when SEL1 is low and /SEL1 or $\overline{SEL1}$ is high), SEL2 is turned on and SEL1 is turned off, allowing the second input clock signal to pass through to the second inverter and blocking the first input clock signal SEL1. The second inverter can invert the signal and output a corresponding signal to the output node, while the first inverter does not substantially affect the output signal since SEL1 is turned off.

The CMOS multiplexers may experience speed and bandwidth issues that occur when multiple clock paths merge at the output of a multiplexer due to the large load capacitance at the output node. This capacitance acts as a load to the multiplexer circuit and affects the time for charging and discharging the capacitance. As communication bandwidth of computing systems increases, clocking speed may outpace scaling of the CMOS technologies. The power and performance advantages of the CMOS clocking can diminish.

Direct current (DC) coupling can be used in CMOS multiplexers for coupling the output of one digital circuit to the input of another digital circuit without coupling capacitors. This technique is preferred over alternating current (AC) coupling because the DC coupling allows for better signal integrity and substantially reduces the loss of DC information. However, when using the DC coupling in high-speed digital circuits such as CMOS multiplexers, there can be several problems that affect the performance of the multiplexer circuit. One of the problems is related to the voltage levels of the signals. In high-speed digital circuits, the voltage levels of the signals can become very sensitive to noise and variations in the power supply voltage. As a result, even small changes in the voltage levels can cause significant errors in the circuit.

Alternatively, a resonant clocking type multiplexer can be used. The resonant multiplexer can include an LC or an RLC tank (described below) that is coupled to a voltage source providing or generating a voltage VDD. The LC tank circuit is a circuit consisting of an inductor (L) and a capacitor (C) that are connected in parallel. The RLC tank includes one or more resistors (R). One or more differential inductors can be electrically coupled between RLC (or LC) tank and outputs CKPo, CKNo. The resonant multiplexer can include two paths for the input signals: path A and path B.

The path A can include transistors which respective gate electrodes are electrically coupled to opposite signals CKP1 and CKN1 that are controlled by a selector providing or generating the signal SEL1. The respective source electrodes of the transistors in the path A can be electrically coupled to a current source electrode. The respective drain electrodes of the transistors in the path A can be electrically coupled via the selector providing or generating the signal SEL1 to the output. The path B can include transistors which respective gate electrodes are electrically coupled to opposite signals CKP2 and CKN2 that are controlled by a selector providing or generating the signal SEL2. The respective source electrodes of the transistors in the path B can be electrically coupled to a current source. The respective drain electrodes of the transistors in the path A can be electrically coupled via the selector providing or generating the signal SEL2 to the output. When the source of the signal SEL1 is activated, the coupled CKP1 and CKN1 are configured to pass through to the output lines CKPo, CKNo, respectively, while path B is blocked due to the source of the signal SEL2 being deactivated. When the source of the SEL2 is activated, the coupled CKP2 and CKN2 are configured to pass through to the output lines CKPo, CKNo, respectively, while the path A is blocked due to the source of the signal SEL1 being deactivated.

In the resonant multiplexer, the LC tank circuit can be used to amplify a resonant frequency that can be used to select a particular frequency signal. When an AC signal is applied to the LC tank circuit, the capacitor stores the electrical energy and the inductor stores the magnetic energy. The energy oscillates back and forth between the inductor and the capacitor at the resonant frequency of the LC tank circuit. In the resonant multiplexer, multiple LC tank circuits can be used to selectively amplify particular frequency signals and reject others. Each LC tank circuit can be tuned to a different resonant frequency, allowing it to selectively pass a particular frequency signal while blocking others. When the input signal is applied to the resonant multiplexer, only the LC tank circuit that is tuned to the frequency of the input signal can be selected to resonate and pass the signal to the output, while the other LC tank circuits are not selected and not used.

The resonant clocking can be used to reduce jitter in clock multiplexers. A resonant clock reduces the jitter in the output clock signal for a high-speed path, e.g., a path having a frequency greater than 20 GHz.

In some embodiments, the LC resonant circuits can have a high Q factor, e.g., LC resonant circuits can amplify the signal more selectively and reduce noise outside a bandwidth, thus, reducing power dissipation and improving jitter performance. However, the resonant multiplexer can have a suboptimal power and/or jitter performance for a low-speed path. Resonant multiplexer may not work well at low speeds since the bandwidth of the resonant multiplexer is inversely proportional to the Q factor of the LC resonant circuits.

Furthermore, loading network needs to be programmable to be tuned to the operating frequency. Additionally, a frequency range of the resonant multiplexer may be limited. For example, the frequency range of the resonant multiplexer is limited by the resonance frequency of the LC circuits. Resonant multiplexers occupy relatively large physical areas to be programmable and/or include multiple LC (or RLC) networks. To increase the frequency range, additional LC circuits with higher resonant frequencies can be added to the resonant multiplexer, but this modification will also increase the complexity and cost of the system.

Another disadvantage of the resonant multiplexer is that the outputs of two paths A and B join at the common outputs CKPo, CKNo. The path that is not used (when the other path is activated) creates an additional loading to the active path.

As the maximum data rate increases, the industry requirement for multi-rates and backward compatibility probably will continue. At the same time, the power, area, and performance cannot be compromised. The multiplexer of the present disclosure can be effective for many high-speed transceivers supporting multi-rates with power scalability and a significantly improved performance.

For the current transceivers having a speed exceeding 100 Gbps, both the resonant clocking and the CMOS clocking are necessary to achieve better jitter/power performance over a wide range of date rates. Most of the clock multiplexers cannot operate with two different types of clocking. The multiplexer of the present disclosure can achieve a significantly improved jitter and/or power performance by allowing different clocking types in one clock multiplexer. The multiplexer described below also improves performance by eliminating the loading of an unused path.

The multiplexer of the present disclosure relates to a resonant-CMOS hybrid clocking with one differential inductor core. Such hybrid multiplexer can multiplex different clocking types in one multiplexer. In some embodiments, CMOS buffers, switches, and the LC network of the present disclosure can reconfigure the clock multiplexer to the resonant clocking for a high-speed path and a CMOS clocking for a low-speed path.

Figure 1C:
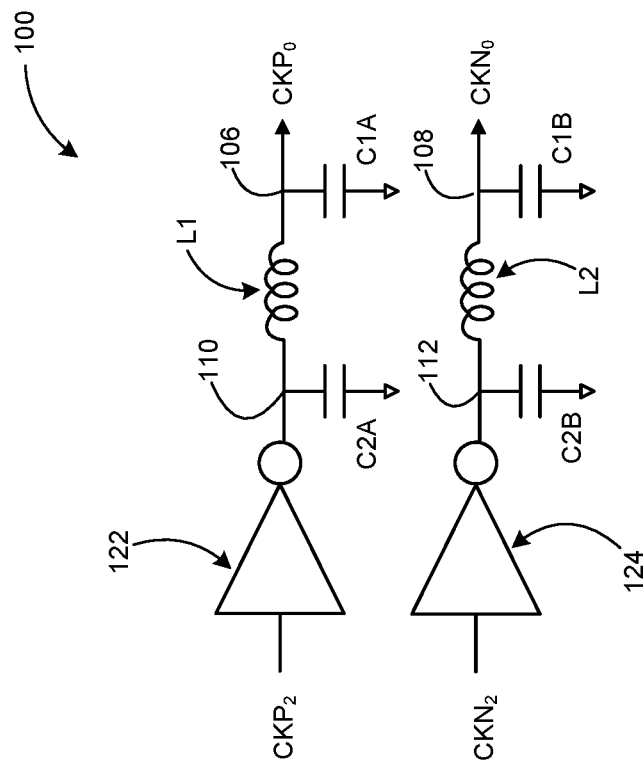
FIG. 1C is a schematic diagram of a hybrid clock multiplexer having CMOS clocking for a low-speed path, according to one or more embodiments.
Figure 1B:
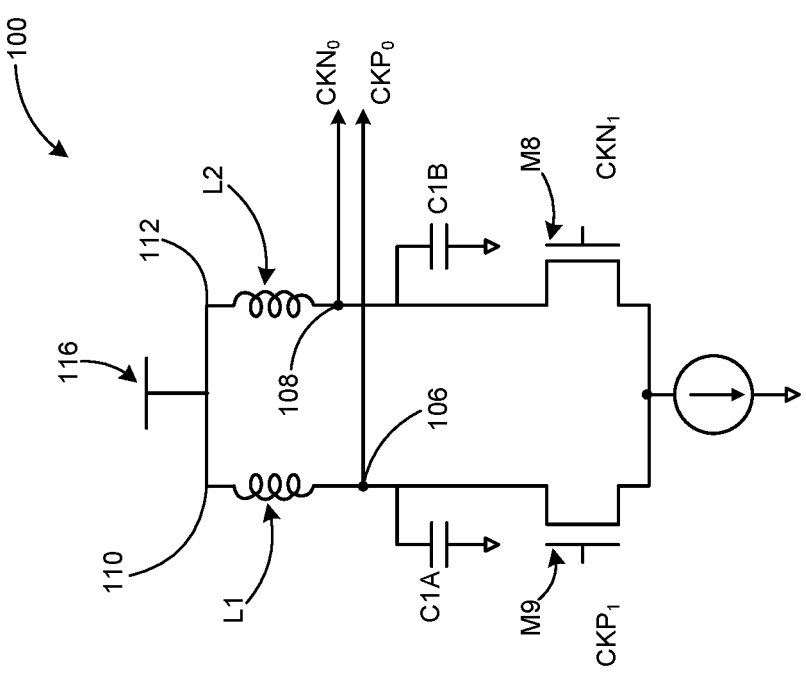
FIG. 1B is a schematic diagram of a hybrid clock multiplexer having a resonant clocking architecture for a high-speed path, according to one or more embodiments.
Figure 2A:
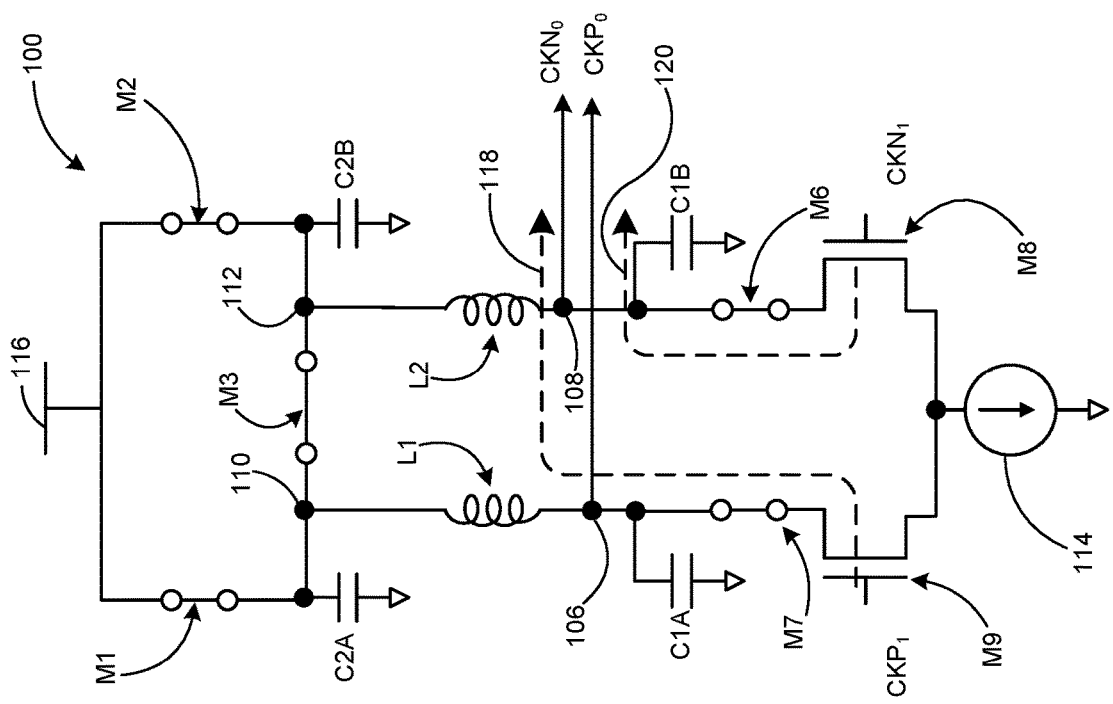
FIG. 2A is a schematic diagram of a hybrid clock multiplexer having a resonant clocking architecture for a high-speed path, according to one or more embodiments.
Figure 2B:
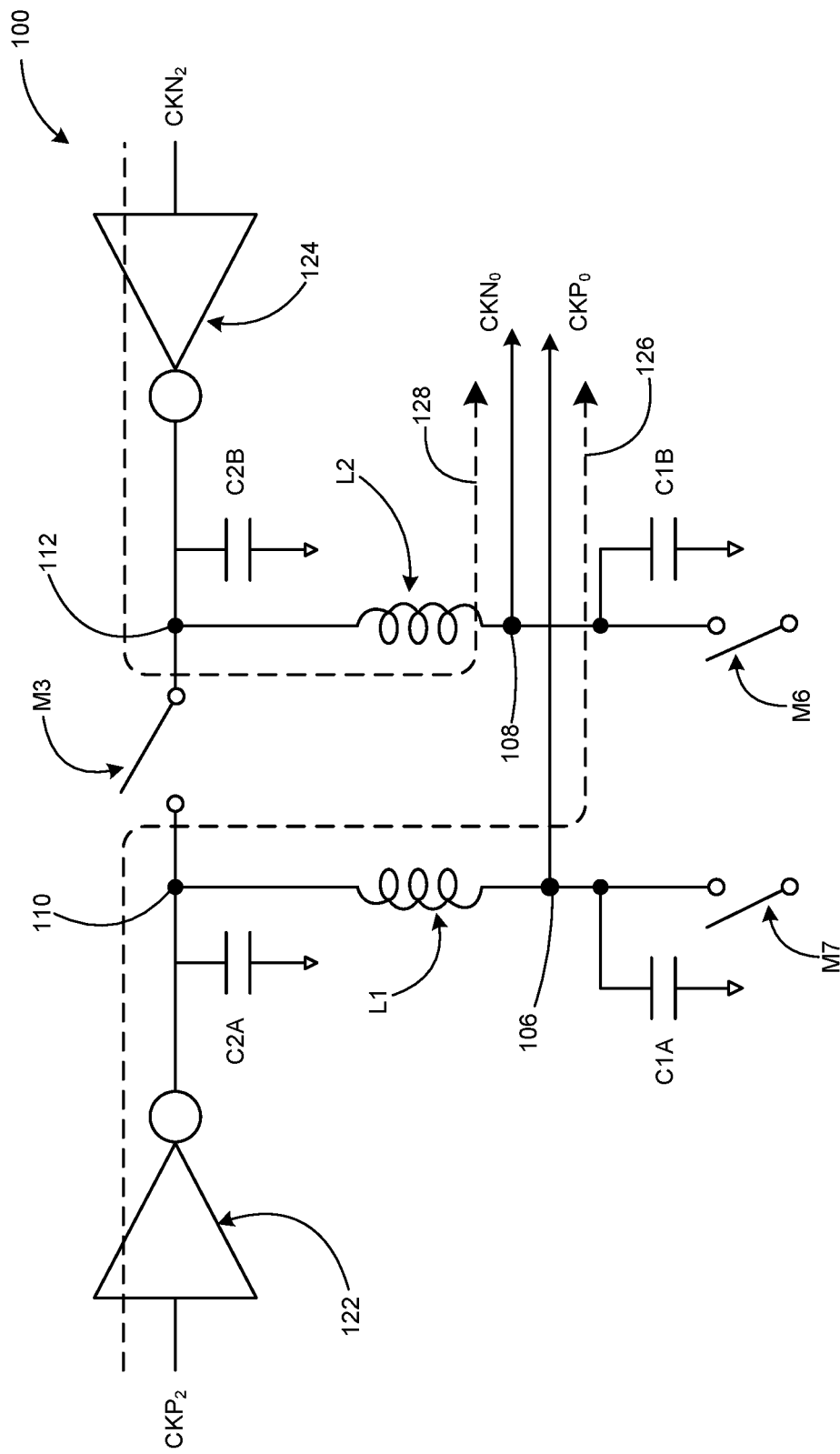
FIG. 2B is a schematic diagram of a hybrid clock multiplexer having CMOS clocking for a low-speed path, according to one or more embodiments.

FIG. 1A is a general schematic diagram of a hybrid clock multiplexer 100 having the resonant clocking architecture for the high-speed path and the CMOS clocking for the low-speed path according to one or more embodiments. The resonant clocking architecture for a high-speed path is illustrated in FIGS. 1B and 2A according to some embodiments. The CMOS clocking for a low-speed path is illustrated in FIGS. 1C and 2B according to some embodiments.

A resonant clock signal can refer to an electrical signal that is amplified at a specific frequency that matches the natural frequency of a resonant circuit. The resonant clock signal can be generated by a resonant circuit that can be designed to amplify at the same frequency as the clock signal and can be used to synchronize the operation of electronic devices or systems. For example, in some embodiments, an LC tuned buffer (or an LC tuned driver) can generate the resonant clock signal. The LC tuned buffer can include an LC resonant circuit that can be electrically coupled with the output driver, which can facilitate filtering out unwanted harmonic frequencies. The LC resonant circuit can be tuned to a desired frequency of operation and provides a relatively sharp roll-off characteristic, which can facilitate improvement of the signal quality and reduction of a signal distortion.

A CMOS clock signal can refer to an electrical signal that is used in CMOS technology-based digital circuits to synchronize their operation. The CMOS clock signal can be generated by a CMOS inverter circuit, which alternately charges and discharges a capacitor to produce, for example, a square wave clock signal. The CMOS clock signal can provide precise timing and synchronization of the circuit's operation. The CMOS clock signal can be used to trigger the sequential operation of various digital devices, such as flip-flops, registers, and counters, in a synchronized and orderly manner.

In some embodiments, the transistors M1-M3 may be P-type transistors (e.g., P-type MOSFETs, P-type FinFETs, P-type BJTs, etc.), and the transistors M4-M9 may be N-type transistors (e.g., N-type MOSFETs, N-type FinFETs, N-type BJTs, etc.). In some embodiments, the multiplexer 100 can be implemented with complementary counter parts, e.g., the transistors M1-M3 can be N-type transistors (not shown) and the transistors M4-M9 can be P-type transistors (not shown). These components may operate together to receive the signals CKP1, CKN1, CKP2, and CKN2 and generate output signals outputs CKPo, CKNo by amplifying or modifying the signals CKP1, CKN1, CKP2, and CKN2.

In some embodiments, the multiplexer 100 includes transistors M1-M9 and inductors L1 and L2. Inductors L1 and L2 can be passive electronic components that store energy in a magnetic field when an electric current flows through the inductors. In some configurations of the multiplexer 100, the inductors L1 and/or L2 can be planar inductors, spiral inductors, solenoid inductors, stacked inductors, vertical inductors, transformer-based inductors, trench inductors, and the like. In some embodiments, the multiplexer 100 includes more, fewer, or different components, or has a different configuration than shown in FIGS. 1A-1C and 2A-2B.

In some embodiments, the multiplexer 100 can include two different clock paths that can merge. In some embodiments, the multiplexer 100 can have two pairs of nodes 106, 110 and 108, 112. In some embodiments, the multiplexer 100 having the resonant-CMOS hybrid clocking can include the inductor core L1 that may receive two clock paths at both ends of the inductor L1. For example, the inductor L1 having two ends is electrically coupled to the node 106 at one end and to the node 110 at the other end.

The nodes may be defined as points within a communication network. Two or more electrical components can be electrically coupled in the node, creating a pathway for the flow of electrical current. For example, the node can represent an intersection of multiple circuit elements, such as resistors, capacitors, and inductors, where the electrical potential or voltage is the same. Each node can be an endpoint for data transmissions or redistribution. Nodes can be configured to recognize, process and forward transmissions to other network nodes.

A coupling (or an electric coupling) refers to the transfer of electrical energy between two or more components in an electrical circuit. The coupling can occur through various means, including an electric field, magnetic field, or direct contact between the components. The electrical energy transfer can occur between any two or more components of an electrical circuit, including capacitors, inductors, resistors, and other devices. The term "coupled between" can refer to a relationship between a first node or component and at least two other nodes or components, where the first component and/or node is connected to between the other components and/or nodes in some way. The use of the term "coupled between" is intended to be broad and inclusive, to encompass a wide range of circuit topologies and configurations. "Coupling between" does not necessarily require a direct connection between the components or nodes. In some embodiments, there may be intervening components and/or nodes between the two or more components or nodes that are coupled, unless language such as "directly coupled between" is used. For example, there may be other components, such as resistors, capacitors, switches, inverters, or inductors, that are connected between the two components and/or nodes that are described as being coupled between.

A circuit (or an electric circuit) refers to a system of interconnected electrical components that operate at least partially together to perform a specific function or set of functions. The circuit may include a pathway of electrical energy flow that is created by connecting various components, such as resistors, capacitors, inductors, transistors, and other devices in a specific order. These components can be designed to regulate and control the flow of electrical energy within the circuit, and their placement and configuration can determine the behavior of the circuit. The circuit may also include a power source, such as a battery or generator, that provides the electrical energy necessary to power the components of the circuit.

In some embodiments, the multiplexer 100 can include the inductor core L2 that may receive two clock paths at both ends of the inductor L2. For example, the inductor L2 having two ends is electrically coupled to the node 108 at one end and to the node 112 at the other end. In some embodiments, a pair 102 of the transistors M7, M9 drives the node 106. In some embodiments, a pair 103 of the transistors M6, M8 drives the node 108. In some embodiments, a pair 104 of the transistors M1, M5 drives the node 110. In some embodiments, a pair 105 of the transistors M2, M4 drives the node 112.

In one configuration, a power source 116 (or a voltage source 116) can be provided. The voltage source 116 can be coupled to source electrodes of the transistors M1 and M2 through a metal rail to receive the supply voltage VDD. The VDD voltage may be a DC voltage. In this configuration, the voltage source 116 allows current to flow between the source electrodes of the transistors M1, M2 and the voltage source 116. In some embodiments, when for example, the transistors M1-M3 are N-type transistors (not shown) and the transistors M4-M9 are P-type transistors (not shown), the ground can be electrically coupled to the source electrode of the transistors M1-M2.

In one configuration, the transistor M1 includes the source electrode electrically coupled to the voltage source 116, a gate electrode receiving the signal CKP2, and a drain electrode electrically coupled to a drain electrode of the transistor M5. In one configuration, the transistor M2 includes the source electrode electrically coupled to the voltage source 116, a gate electrode receiving the signal CKN2, and a drain electrode electrically coupled to a drain electrode of the transistor M4. In some embodiments, the transistor M5 includes a gate electrode electrically coupled to a gate electrode of the transistor M1 and the output of the clock source providing or generating the signal CKP2.

The transistor M3 can be provided to couple the drain electrodes of the transistors M1, M2, M4, and M5. A gate electrode of the transistor M3 can be electrically coupled to an output of a /SEL1 circuit providing a /SEL1 signal (that is a differential signal with respect to the SEL1 signal). The drain electrodes of the transistors M1 and M5 can be electrically coupled to a drain or source electrode of the transistor M3. The drain electrodes of the transistors M2 and M4 can be electrically coupled to the drain or source electrode of the transistor M3. The /SEL1 circuit (not shown) may provide the /SEL1 signal to the gate electrode of the transistor M3. The /SEL1 signal may be a DC voltage. In some embodiments, a drain electrode of the transistor M4 is electrically coupled to a metal rail to receive a ground voltage GND. In some embodiments, a drain electrode of the transistor M5 is electrically coupled to a metal rail to receive a ground voltage GND. In this configuration, the pair 104 of the transistors M1, M5 is configured to be pulled up together with the pair 105 of the transistors M2, M4 when the signal SEL1 is activated in the high mode (corresponding to /SEL1 in the low mode).

In one configuration, a current source 114 can be electrically coupled to a metal rail to receive a ground voltage GND. The current source 114 can be electrically coupled to source electrodes of the transistors M8 and M9. In this configuration, the current source 114 may allow current to flow to the source electrodes of the transistor M8 and M9. In some embodiments, when for example, the transistors M1-M3 are N-type transistors (not shown) and the transistors M4-M9 are P-type transistors (not shown), a current source 114 can be electrically coupled through a metal rail to receive the supply voltage VDD.

In one configuration, the transistor M9 includes the source electrode electrically coupled to the drain electrode of the current source 114, a gate electrode receiving the signal CKP1, and a drain electrode electrically coupled to a source electrode of the transistor M7. In one configuration, the transistor M8 includes the source electrode electrically coupled to the drain electrode of the current source 114, a gate electrode receiving the signal CKN1, and a drain electrode electrically coupled to a source electrode of the transistor M6. In some embodiments, the transistor M7 includes a gate electrode electrically coupled to a gate electrode of the transistor M6 and a SEL1 circuit (not shown). The SEL1 circuit may provide the signal SEL1 to the gate electrodes of the transistors M7, M6. The signal SEL1 may be the DC voltage. In some embodiments, a drain electrode of the transistor M7 is electrically coupled to an output of the multiplexer 100, at which the signal CKPo can be generated or provided. In some embodiments, a drain electrode of the transistor M6 is electrically coupled to the output of the multiplexer 100, at which the signal CKNo can be generated or provided. In this configuration, the transistors M9, M8 may operate as a differential pair circuit that can pull down one of the voltages of the signals CKPo, CKNo according to the differential signals CKP1, CKN1. In one configuration, the transistors M7, M6 operate as cascade transistors to provide high output impedance at the outputs of the multiplexer 100. In another configuration, the transistors M7, M6 can operate as switches. For example, in response to the signal CKP1 having a higher voltage than the signal CKN1, more current can flow through the transistor M9 than through the transistor M8. In response to more current flowing through the transistor M9 than through the transistor M8, the voltage of the signal CKPo corresponding to the signal CKP1 can be lower than the voltage of the signal CKNo corresponding to the signal CKN1.

In one configuration, the inductors L1 and L2 are electrically coupled to the outputs of the multiplexer 100 in parallel with respective branches of the multiplexer 100 including the transistor pairs 102 and 103, respectively. In one configuration, the inductors L1 and L2 are electrically coupled to the outputs of the multiplexer 100 in series with respective branches of the multiplexer 100 including the transistor pairs 104 and 105, respectively. For example, one end of the inductor L1 can be electrically coupled to the node 106 that electrically couples the drain electrode of the transistor M7, and another end of the inductor L1 can be electrically coupled to the node 110 that is electrically coupled to the source or drain electrode of the transistor M3 and the drain electrodes of the transistors M1 and M5. For example, one end of the inductor L2 can be electrically coupled to the node 108 that electrically couples the drain electrode of the transistor M6, and another end of the inductor L2 can be electrically coupled to the node 112 that is electrically coupled to the source or drain electrode of the transistor M3 and the drain electrodes of the transistors M2 and M4.

FIGS. 1B-1C and 2A-2B illustrate general schematic diagram of a hybrid clock multiplexer 100 providing a load reduction by a resonant clocking architecture for a high-speed path and CMOS clocking for a low-speed path according to one or more embodiments. FIGS. 1B and 2A illustrate a path 1 (generally denoted with arrows 118, 120) of the multiplexer 100 when the resonant clocking is active according to some embodiments. In some embodiments of the resonant clocking implementation, the signal SEL1 is selected in the high mode (e.g., SEL1 corresponds to 1) and /SEL1 corresponds to the low mode (e.g., /SEL1 corresponds to 0). The pair 104 (FIG. 1A) of the transistors M1, M5 is configured to be pulled down together with the pair 105 of the transistors M2, M4 when the signal SEL1 is activated in the high mode (corresponding to /SEL1 in the low mode). The transistor M3 is activated when the signal /SEL1 (that is in the low mode) transmitted to the gate electrode of the transistor M3. The transistor M3 operates as a closed switch in such configuration electrically coupling the nodes 110 and 112. The transistor M1 is activated and operates as a closed switch conducting current between its source and drain electrodes. The transistor M2 is activated and operates as a closed switch conducting current between its source and drain electrodes. The transistor M6 is activated by the signal SEL1 that is transmitted to its gate electrode and the transistor M6 operates as a closed switch conducting current between its source and drain electrodes. The transistor M7 is activated by the signal SEL1 that is transmitted to its gate electrode and the transistor M7 operates as a closed switch conducting current between its source and drain electrodes. The transistors M8, M9 that are electrically coupled to the transistors M6, M7, respectively, transmit the respective signals CKN1, CKP1 received from the outputs of the circuits transmitting CKN1, CKP1 signals.

A closed state in a circuit refers to a condition in which an electrical circuit is in a complete state, allowing for the unrestricted flow of electrical current through it. The closed state is characterized by the position of the electrical switch, relay, or any other device that controls the flow of current in the circuit, which is in a position that permits the uninterrupted flow of electrical current through the circuit. The closed state enables the circuit to function as intended and ensures the proper distribution of electrical power to the various components of the circuit.

The single differential inductor including two inductors L1 and L2 operates as a shunt picked inductor. A differential inductor may be a 3-terminal network composed of two coupled inductors L1 and L2 with an arbitrary coupling factor (k) between the coupled inductors. In the limiting case when k equals to zero, the differential inductor is substantially the same as two isolated inductors L1 and L2. The differential inductor may be formed by the respective windings of the inductors L1 and L2. The load network of the multiplexer 100 becomes LC resonant with the shunt inductor that is electrically coupled with the transistors M9 and M8 where the respective gate electrodes the transistors M9 and M8 receive the signals CKP1 and CKN1. The shunt inductor circuit may include one or more inductors and capacitors electrically coupled in parallel to the load. The inductors L1, L2 enable higher impedance for high-frequency signals, while the capacitors offer lower impedance for the same signals. By selecting suitable values for the inductors and capacitors, the network can be tuned to effectively block unwanted low-frequency and high-frequency signals. The multiplexer 100 having a shunt inductor in parallel with a transistor can be used to switch the power supply in the circuit. The shunt inductor facilitates fine-tuning of the resonant frequency of the inductor and capacitor combination and provides a more efficient switching between frequencies. The resonant clocking having a shunt inductor can reduce power consumption according to some embodiments. Additionally, the shunt inductor facilitates smoothing out the current flow, reducing voltage spikes and noise.

The resonant clocking corresponding to path 1 facilitates an improved quality of the high frequency clock (e.g., for frequencies greater than 20 GHz). In some embodiments, the capacitance C2 (corresponding to C2A, C2B) that relates to path 2 denoted with arrows 126, 128 (FIG. 2B) for the CMOS clocking substantially is not present in the differential signal path 1 denoted with arrows 118, 120. In some embodiments, when the resonant clocking path 1 (118, 120) is active, the capacitance C2 (C2A, C2B) is commonly loaded between the two inductors L1 and L2. When the resonant clocking path 1 (denoted with arrows 118, 120) is active, the multiplexer 100 removes or substantially reduces loading of the inactive path 2 (denoted with arrows 126, 128). Such reduced loading reduces power consumption and enhances clock quality.

In some embodiments, the pair 102 of transistors M7, M9 and the pair 103 of transistors M6, M8 drive the nodes 106 and 108, respectively; however, it should be understood that other configurations or combination of circuits may be used. For example, in some embodiments, a Current Mode Logic (CML) can be implemented using the CMOS transistors M6, M7, M8, M9 and/or bipolar transistors (not shown). The CML is a high-speed, low-power digital logic family that operates using differential current signals. CML can have a low power consumption, a high-speed operation, and a substantial noise immunity. In a CML circuit using the bipolar transistors, the input signals can be applied to the bases of two bipolar transistors, which form a differential pair. The differential pair can be biased by a constant current source, and the output of the differential pair can be fed into a current mirror, which generates a copy of the input current with a fixed gain. The output current of the current mirror can be used to drive the load circuit, which converts the current signal into a voltage signal that can be measured and used as the output of the gate.

FIGS. 1C and 2B illustrate the multiplexer 100 according to some embodiments when the CMOS clocking is active. In some embodiments, this configuration of the multiplexer 100 corresponds to path 2 denoted with arrows 126, 128. In some embodiments, the multiplexer 100 can have the nodes 106, 110, 108, 112 and the inductors L1, L2 electrically coupled identically to or similarly in some respect to the nodes 106, 110, 108, 112 and the inductors L1, L2 of the multiplexer 100 of FIG. 1A. In some embodiments, the pair 104 of the transistors M1, M5 drives the node 110; the pair 105 of the transistors M2, M4 drives the node 112.

In some embodiments of the CMOS clocking, the signal SEL1 is selected in the low mode (e.g., SEL1 corresponds to 0) and /SEL1 corresponds to the high mode (e.g., /SEL1 corresponds to 1). In this configuration, the transistors M1, M2 may operate as a differential pair and the transistors M4, M5 may operate as a differential pair that, according to the signals CKP2, CKN2, can pull up one of the voltages at the nodes 110, 112 and pull down the complementary voltage at the nodes 112, 110 (and correspondingly pull up or pull down the outputs of signals CKPo, CKNo, e.g., the nodes 106 and 108 that are electrically coupled to the nodes 110, 112) when, for example, a SEL1 signal is in a low mode (corresponding to /SEL1 being in a high mode). The drain electrode of the transistor M9 is electrically coupled to the source electrode of the transistor M7. The CKP1 signal transmitted to the gate electrode of the transistor M9 is not transmitted further to the output CKPo when the transistor M7 has an open circuit caused by the signal SEL1 being in the low mode. The transistor M7 is deactivated and operates as an open switch not conducting current between its source and drain electrodes. The drain electrode of the transistor M8 is electrically coupled to the source electrode of the transistor M6. The CKN1 signal transmitted to the gate electrode of the transistor M8 is not transmitted further to the output CKNo when the transistor M6 has an open circuit caused by the signal SEL1 being in the low mode. The transistor M6 is deactivated and operates as an open switch not conducting current between its source and drain electrodes. The transistor M3 is deactivated when the signal /SEL1 (that is in the high mode) is transmitted to the gate electrode of the transistor M3. The transistor M3 operates as an open switch in such configuration electrically decoupling the nodes 110 and 112.

An open state in a circuit refers to a condition in which an electrical circuit is incomplete, preventing the flow of electrical current through it. The open state is characterized by the position of the electrical switch, relay, or any other device that controls the flow of current in the circuit, which is in a position that prevents the flow of electrical current through the circuit. The open state is an aspect of the circuit's operation that facilitates electrical power not being distributed to the various components of the circuit when it is not intended to do so.

Decoupling (or electric decoupling) refers to the prevention of the transfer of electrical energy between two or more components in an electrical circuit. For example, the components being "decoupled" may refer to the components being electrically decoupled, e.g., being in such a state that decoupling does not allow the electrical signal to pass between the components. The decoupling can occur through various means, including insulation, shielding, open switches, or other methods that block or minimize the transfer of electrical energy. The blocking or minimization of electrical energy transfer can occur between any two or more components of an electrical circuit, including capacitors, inductors, resistors, and other devices.

In some embodiments, a pull-up and/or pull-down switch can operate as a CMOS driver. In some embodiments, a CMOS circuit can be converted into an inverter by utilizing either a single NMOS or PMOS transistor and its complementary transistor as pull-up and pull-down switches.

According to some embodiments, the pair 104 of the transistors M1, M5 is converted into an inverter 122 by the signal /SEL1 that disconnects the nodes 110 and 112. In some embodiments, the inverter 122 transmits the signal CKP2 received by the gate electrodes of the transistors M1, M5. In some embodiments, the pair 105 of the transistors M2, M4 is converted into an inverter 124 by the signal /SEL1 disconnects the nodes 110 and 112. In some embodiments, the inverter 124 transmits the signal CKN2 received by the gate electrodes of the transistors M2, M4. The inverters 122, 124 are electrically coupled in series to the inductors L1, L2, respectively, and transmit to the outputs CKPo, CKNo the respective signals CKP2, CKN2.

In some embodiments, the multiplexer 100 can include partial capacitances C1A, C1B, C2A, and/or C2B. Partial capacitance in a circuit refers to the capacitance of a specific section of the circuit. For example, the partial capacitance C1A is a capacitance of the lower left section of the multiplexer 100 before the node 106. For example, the partial capacitance C1B is a capacitance of the lower right section of the multiplexer 100 before the node 108. For example, the partial capacitance C2A is a capacitance of the upper left section of the multiplexer 100 before the node 110. For example, the partial capacitance C2B is a capacitance of the upper right portion of the multiplexer 100 before the node 112. Generally, the partial capacitance describes the ability of a particular section of the circuit to store electrical charge and the amount of electrical energy that can be stored within that section. The partial capacitance can be determined by the characteristics of the components within that section of the circuit, such as the type of material, the distance between the components, and their geometries.

In the CMOS clocking configuration, the load network is series peaked allowing the multiplexer 100 to split and distribute capacitances C1A, C2A and C1B, C2B across the series inductors L1 and L2 along paths 126 and 128, respectively. The multiplexer 100 distributes the loading when the CMOS clocking path 126, 128 is active. The distribution of loading saves power and enhances clock quality. The inductors L1 and L2 coupled in series on the paths 126 and 128 improve drivability and rise-fall time of the multiplexer 100. This configuration facilitates attenuation of changes in the current being charged or discharged. The individual inductors in the different paths 126, 128 provide impedance to changes in current, and their combination offers a greater overall impedance to the current changes. The CMOS clocking configuration facilitates the DC coupling. The multiplexer 100 having the CMOS clocking is substantially not constrained by the low frequency limit.

In some embodiments, the hybrid clock multiplexer 100 having the resonant clocking architecture for a high-speed path 118, 120 and the CMOS clocking mode for a low-speed path 126, 128 can enable optimal clocking types for power and/or jitter performance applied to various clock frequencies. For the resonant clocking of the multiplexer 100, the single differential inductor that comprises at least two inductors L1 and L2 can operate as a shunt inductor in the LC tank. When the multiplexer 100 operates in the CMOS clocking mode, the differential inductor is reconfigured as two series inductors L1 and L2, which improves drivability and rise-fall time. The CMOS inverter operates as a driver for the CMOS clocking mode. The identical or similar CMOS inverter can operate as a pull-up switch when the resonant clocking is selected.

In some embodiments, the multiplexer 100 provide the clock frequency scaling. For example, the multiplexer 100 can support multi-rates that can range between the low frequency and the high frequency where the highest frequency exceeds the lowest frequency at least by a factor of two. The system that includes the multiplexer 100 can extend the frequency range of operation because the resonant clocking increases upper frequency limit and the CMOS clocking eliminates or substantially reduces the low frequency limit. A user may program a controller that switches between the different clocking modes. One or more devices 402 (FIG. 4A) that may include the system with the multiplexer 100 can support a wide range of the data rate and various standards as well as exhibit performance advantages in comparison to the conventional multiplexers. In some embodiments, the multiplexer 100 can provide significantly improved jitter and/or power scaling over the different data rates.

According to some embodiments, the high-speed transceivers that include the multiplexer 100 with a wide frequency range of operation can be used in network switches, that can be, for example, used in data centers. According to some embodiments, the high-speed transceivers with a wide frequency range of operation can be used in a high-speed Physical Layer Protocol (PHY) and in coherent optical transceivers. According to some embodiments, the high-speed transceivers a with wide frequency range of operation can be used for 5G, 6G and other microwave wideband data capture. In some embodiments, the multiplexer 100 can be used in the systems that utilize multiple frequencies of operation for wireline and coherent optical applications.

Figure 3A:
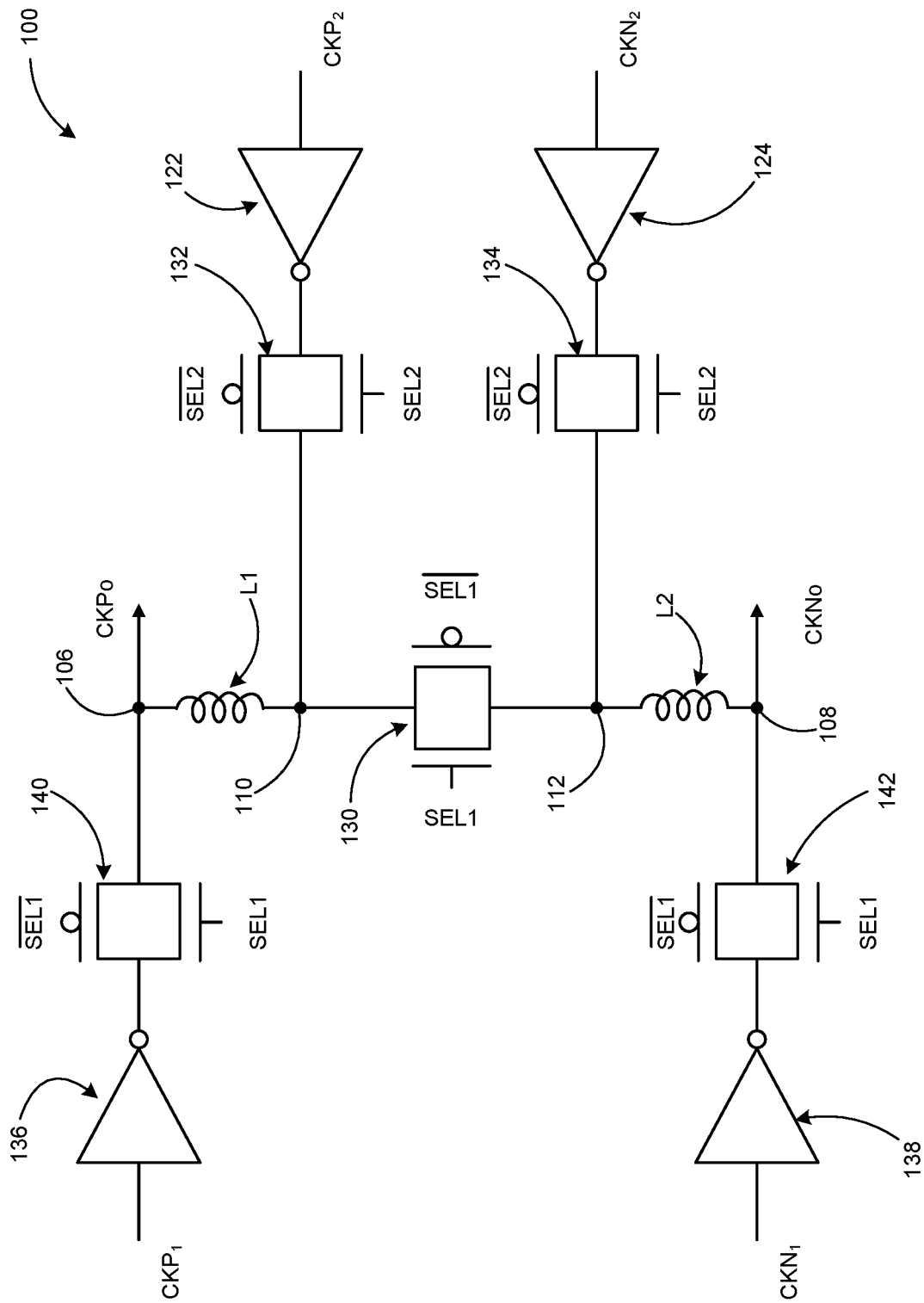
FIG. 3A is a schematic diagram of a hybrid clock multiplexer, according to one or more embodiments.

FIG. 3A is a general schematic diagram of a clock multiplexer 100 having a resonant clocking architecture for a high-speed path and CMOS clocking for a low-speed path according to one or more embodiments. The resonant clocking architecture for a high-speed path is illustrated in FIG. 3B according to some embodiments. The CMOS clocking for a low-speed path is illustrated in FIG. 3C according to some embodiments.

In some embodiments, the multiplexer 100 illustrated in FIGS. 3A-3C has inverters 122, 124, 136, 138 that can be converted from pull-up and/or pull-down switches identically or similarly to the inverters 122, 124 illustrated in FIGS. 1C and 2B. In some embodiments, the multiplexer 100 can include a plurality of transmission gates 130, 132, 134, 140, 142. The transmission gates 130, 140, and 142 can be configured to be controlled at least by differential SEL1 and /SEL1 signals. The transmission gates 132 and 134 can be configured to be controlled at least by differential SEL2 and /SEL2 signals.

In some embodiments, the multiplexer 100 can have two pairs of nodes 106, 110 and 108, 112. In some embodiments, the inductor L1 having two ends is electrically coupled to the node 106 at one end and to the node 110 at the other end. In some embodiments, the inductor L2 having two ends is electrically coupled to the node 108 at one end and to the node 112 at the other end. In some embodiments, the inverter 122 drives the node 110, the inverter 124 drives the node 112, the inverter 136 drives the node 106, and the inverter 138 drives the node 108.

In comparison to some embodiments described above (for example, in illustrated in FIGS. 1A-1C and 2A-2B), in the configuration illustrated in FIGS. 3A-3C, the resonant clocking path can include the CMOS driver implementation. For example, in some embodiments the CMOS inverters 136, 138 can be used optionally or alternatively to the respective differential pairs 102, 103 of the transistors and tail current. In some embodiments, the LC network (that, for example, includes the inductors L1, L2) can be identical or similar to the embodiments illustrated in FIGS. 1A-1C and 2A-2B. In some embodiments, the pull-up and/or pull-down switches can be modified accordingly. For example, the switch types in the embodiments illustrated in FIGS. 1A-1C and 2A-2B can be modified in at least one of the following ways: (i) some switches may be removed when the inactive path signal is properly gated and/or (ii) a switch that includes only PMOS transistors can be changed to a transmission gate switch.

FIG. 3B illustrates a multiplexer 100 having a resonant clocking architecture for the high-speed path. In some embodiments, when SEL1 is high and /SEL1 is low (that can be at the same time when SEL2 is low and /SEL2 is high), SEL1 is turned on and SEL2 is turned off. In this configuration, the transmission gates 130, 140, 142 are on; the transmission gates 130, 140, 142 operate as closed switches and conduct the current. In this configuration, the transmission gates 132, 134 are off; the transmission gates 132, 134 operate as open switches and do not conduct the current.

In some embodiments, a branch of the multiplexer 100 having the inverter 136 conducts the current corresponding to the signal CKP1 when the signal SEL1 is activated in a high mode (corresponding to the signal /SEL1 in the low mode). The transmission gate 140 is activated and operates as a closed switch conducting current between the inverter 136 and the output line corresponding to the output signal CKPo. In some embodiments, a branch of the multiplexer 100 having the inverter 138 conducts the current corresponding to the signal CKN1 when the signal SEL1 is activated in a high mode (corresponding to the signal /SEL1 in the low mode). The transmission gate 142 is activated and operates as a closed switch conducting current between the inverter 138 and the output line corresponding to the output signal CKNo of the multiplexer 100. The inverters 136 and 138 transmit the respective input signals CKP1, CKN1 to the output lines of the multiplexer 100 corresponding to the output signals CKPo, CKNo, respectively.

In some embodiments, a branch of the multiplexer 100 having the inverter 122 does not conducts the current corresponding to the signal CKP2 when the signal /SEL2 is activated in the high mode (corresponding to SEL2 in the low mode). The transmission gate 132 is deactivated and operates as an open switch blocking the current between the inverter 122 and the output line corresponding to the output signal CKPo of the multiplexer 100. In some embodiments, a branch of the multiplexer 100 having the inverter 124 does not conducts the current corresponding to the signal CKN2 when the signal /SEL2 is activated in the high mode (corresponding to the signal SEL2 in the low mode). The transmission gate 134 is deactivated and operates as an open switch blocking the current between the inverter 124 and the output line corresponding to the output signal CKNo of the multiplexer 100. The inverters 122 and 124 do not transmit the respective input signals CKP2, CKN2 to the output lines of the multiplexer 100 corresponding to the output signals CKPo, CKNo, respectively.

The transmission gate 130 is activated by the signal SEL1 and operates as a closed switch in such configuration electrically coupling the nodes 110 and 112. The single differential inductor including two inductors L1 and L2 operates as a shunt picked inductor. The load network of the multiplexer 100 becomes LC resonant with the shunt inductor that is electrically coupled with the inverters 136 and 138 to receive the signals CKP1 and CKN1, respectively. The shunt inductor circuit illustrated in FIG. 3B operates identically or similarly to the shunt inductor illustrated in FIGS. 1B and 2A.

In some embodiments, capacitance C2 (corresponding to C2A, C2B) that relates to the CMOS clocking path with series peaking (FIG. 3C) is not present in the differential signal path of the resonant clocking. When the resonant clocking path is active, the multiplexer 100 removes or substantially reduces loading of the inactive path corresponding to the CMOS clocking path with series peaking. Such reduced loading reduces power consumption and enhances clock quality.

FIG. 3C illustrates the multiplexer 100 according to some embodiments when the CMOS clocking is active. In some embodiments, the multiplexer 100 can have the nodes 106, 110, 108, 112 and the inductors L1, L2 electrically coupled identically to or similarly in some respect to the multiplexer 100 of FIG. 3A. In some embodiments, the inverter 122 drives the node 110, the inverter 124 drives the node 112.

In some embodiments of the CMOS clocking, when the signal SEL2 is high and the signal /SEL2 is low (that can be at the same time when the signal SEL1 is low and the signal /SEL1 is high), the signal SEL2 is on and the signal SEL1 is off. In this configuration, the transmission gates 130, 140, 142 are off, they operate as open switches and do not conduct the current. In this configuration, the transmission gates 132, 134 are on, they operate as closed switches and conduct the current.

In some embodiments, a branch of the multiplexer 100 having the inverter 122 conducts the current corresponding to the signal CKP2 when the signal SEL2 is activated in the high mode (corresponding to the signal /SEL2 in the low mode). The transmission gate 132 is activated and operates as a closed switch conducting current between the inverter 122 and the inductor L1 (that is electrically coupled in series between the nodes 106 and 110) that is further electrically coupled to the output line corresponding to the output signal CKPo. In some embodiments, a branch of the multiplexer 100 having the inverter 124 conducts the current corresponding to the signal CKN2 when the signal SEL2 is activated in the high mode (corresponding to the signal /SEL2 in the low mode). The transmission gate 134 is activated and operates as a closed switch conducting current between the inverter 124 and the inductor L2 (that is electrically coupled in series between the nodes 108 and 112) that is further electrically coupled to the output line corresponding to the output signal CKNo. The inverters 122 and 124 transmit the respective input signals CKP2, CKN2 to the output lines of the multiplexer 100 corresponding to the output signals CKPo, CKNo, respectively.

In some embodiments, a branch of the multiplexer 100 having the inverter 136 does not conduct the current corresponding to the signal CKP1 when the signal /SEL1 is activated in the high mode (corresponding to the signal SEL1 in the low mode). The transmission gate 140 is deactivated and operates as an open switch blocking the current between the inverter 136 and the output line corresponding to the output signal CKPo. In some embodiments, a branch of the multiplexer 100 having the inverter 138 does not conduct the current corresponding to the signal CKN1 when the signal /SEL1 is activated in the high mode (corresponding to the signal SEL1 in the low mode). The transmission gate 142 is deactivated and operates as an open switch blocking the current between the inverter 138 and the output line corresponding to the output signal CKNo. The inverters 136 and 138 do not transmit the respective input signals CKP1, CKN1 to the output lines of the multiplexer 100 corresponding to the output signals CKPo, CKNo, respectively.

The transmission gate 130 is deactivated by the signal /SEL1 and operates as an open switch in such configuration electrically decoupling the nodes 110 and 112. The inverters 122, 124 are electrically coupled at the nodes 110, 112 in series to the inductors L1, L2, respectively, and transmit the respective signals CKP2, CKN2 to the outputs of the multiplexer 100 corresponding to the output signals CKPo, CKNo.

In the CMOS clocking configuration, the load network is series peaked allows the multiplexer 100 to split and distribute capacitances C1A, C2A and C1B, C2B across the series inductors L1 and L2, respectively. The multiplexer 100 distributes the loading when the CMOS clocking path is active, such distribution of loading saves power and enhances clock quality. The inductors L1 and L2 connected in series on the respective branches of the multiplexer 100 improve drivability and rise-fall time of the multiplexer 100. This configuration facilitates attenuation of changes in the current being charged or discharged. The individual inductors in the different paths provide impedance to changes in current, and their combination offers a greater overall impedance to current changes. In some embodiments, the CMOS clocking configuration facilitates the DC coupling. The multiplexer 100 having the CMOS clocking is substantially not constrained by the low frequency limit.

In some embodiments, the hybrid clock multiplexer 100 having the resonant clocking architecture for the high-speed path and the CMOS clocking for the low-speed path can enable optimal clocking types for power and/or jitter performance applied to various clock frequencies. For the resonant clocking of the multiplexer 100, the single differential inductor that comprises at least two inductors L1 and L2 can operate as a shunt inductor in the LC tank. When the multiplexer 100 operates in the CMOS clocking, the differential inductor can be reconfigured as two series inductors L1 and L2, which improves drivability and rise-fall time. The CMOS inverter operates as a driver for the CMOS clocking. The identical or similar CMOS inverter can operate as a pull-up switch when resonant clocking is selected.

In some embodiments, the multiplexer 100 can have a low power consumption because the multiplexer 100 substantially eliminates and/or distributes loading capacitance from the unused path. In some embodiments, the multiplexer 100 can have a smaller physical area by having a single differential LC core (that comprises of the inductors L1, L2). In some embodiments, the multiplexer 100 can facilitate a better integration with small sized single differential LC core. The risk of coupling between the different frequency components of the multiplexer 100 can also be reduced according to some embodiments.

In some embodiments, a low power and significantly better jitter performance can be achieved by the multiplexer 100 multiplexing different clocking style and optimizing for various clock frequencies. In some embodiments, a system implementing the multiplexer 100 may have an improved bit error rate due to an improved jitter performance. The system implementing the multiplexer 100 may have a low power and efficient power scaling.

The following IEEE standard(s), including any draft versions of such standard(s), are hereby incorporated herein by reference in their entirety and are made part of the present disclosure for all purposes IEEE 802.3, IEEE 802.11x, IEEE 802.11ad, IEEE 802.11ah, IEEE 802.11aj, IEEE 802.16 and 802.16a, and IEEE 802.11ac. In addition, although this disclosure may reference aspects of these standard(s), the disclosure is in no way limited by these standard(s).

Figure 4A:
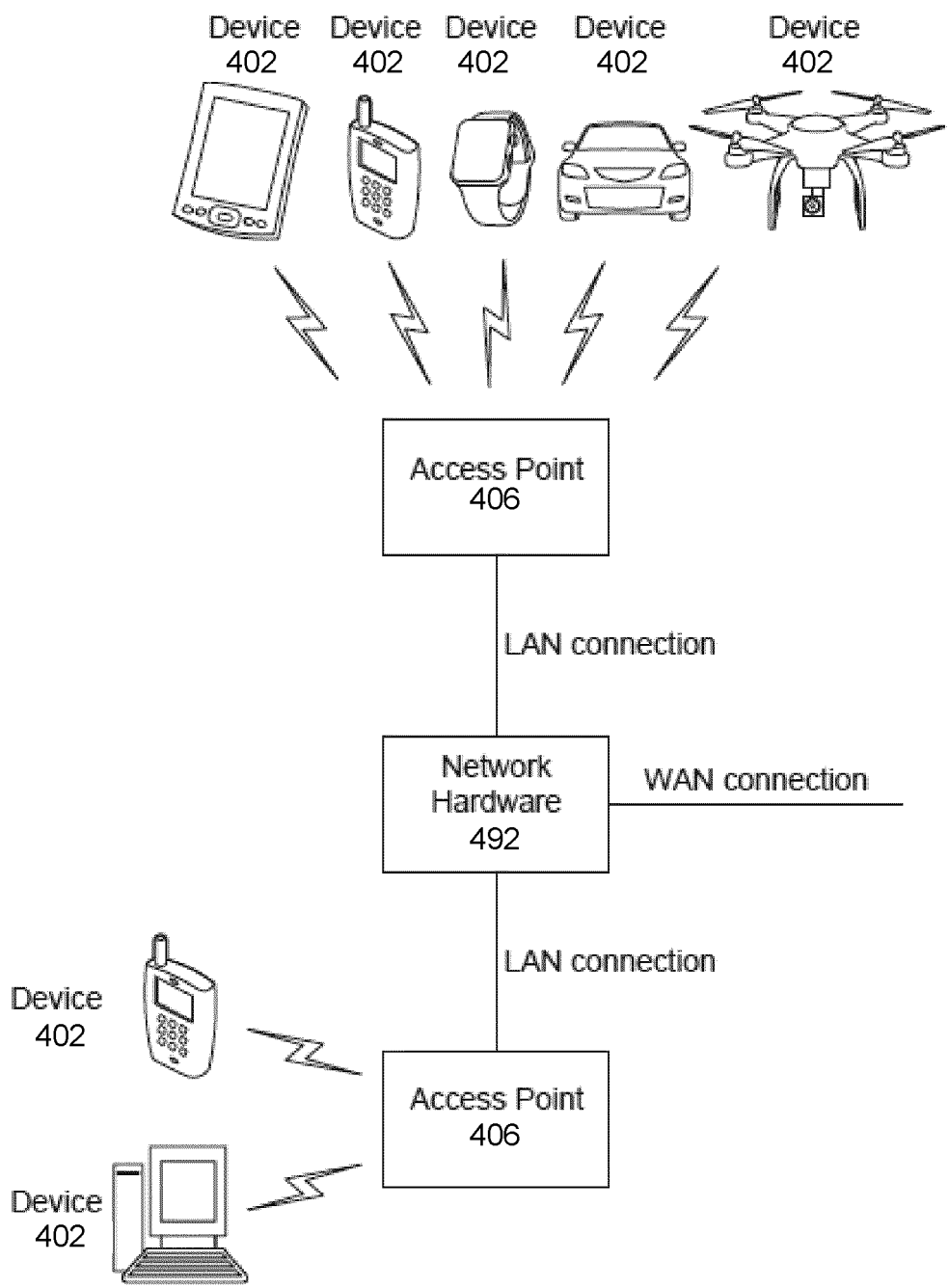
FIG. 4A is a block diagram depicting an embodiment of a computing environment including one or more access points in communication with one or more wireless devices or stations.

Having discussed specific embodiments of the present solution, it may be helpful to describe aspects of the operating environment as well as associated system components (e.g., hardware elements) in connection with the methods and systems described herein. Referring to FIG. 4A, an embodiment of a network environment is depicted. The network may include or be in communication with one or more storage area networks (SANs), security adapters, or Ethernet converged network adapters (CNAs). In brief overview, the network environment includes a wireless communication system that includes one or more access points 406, one or more wireless communication devices 402 and a network hardware component 492. The wireless communication devices 402 may, for example, include laptop computers 402, tablets 402, personal computers 402, wearable devices 402, vehicles 402 (e.g., automobiles, drones, smart vehicles, robotic units, etc.), video game consoles 402, cellular telephone devices 402, smart TV sets 402, Internet of Thing (IoT) devices 402, and any other electronic devices 402 capable of wireless communication. The details of an embodiment of wireless communication devices 402 and/or access point 406 are described in greater detail with reference to FIGS. 4B and 4C. The network environment can be an ad hoc network environment, an infrastructure wireless network environment, a wired network coupled to a wireless network, a subnet environment, etc., or a combination of the foregoing, in one embodiment.

The access points (APs) 406 may be operably coupled to the network hardware 492 via local area network connections. The network hardware 492, which may include one or more routers, gateways, switches, bridges, modems, system controllers, appliances, etc., may provide a local area network connection for the communication system. Each of the access points 406 may have an associated antenna or an antenna array to communicate with the wireless communication devices in its area. The wireless communication devices may register with a particular access point 406 to receive services from the communication system (e.g., via a SU-MIMO or MU-MIMO configuration). For direct connections (i.e., point-to-point communications), some wireless communication devices may communicate directly via an allocated channel and communications protocol. Some of the wireless communication devices 402 may be mobile or relatively static with respect to the access point 406.

In some embodiments an access point 406 includes a device or module (including a combination of hardware and software) that allows wireless communication devices 402 to connect to a wired network using Wi-Fi, or other standards. An access point 406 may sometimes be referred to as a wireless access point (WAP). An access point 406 may be configured, designed and/or built for operating in a wireless local area network (WLAN). An access point 406 may connect to a router (e.g., via a wired network) as a standalone device in some embodiments. In other embodiments, an access point 406 can be a component of a router. An access point 406 can provide multiple devices access to a network. An access point 406 may, for example, connect to a wired Ethernet connection and provides wireless connections using radio frequency links for other devices 402 to utilize that wired connection. An access point 406 may be built and/or configured to support a standard for sending and receiving data using one or more radio frequencies. Those standards, and the frequencies they use may be defined by the IEEE (e.g., IEEE 802.11 standards). An access point 406 may be configured and/or used to support public Internet hotspots, and/or on an internal network to extend the network's Wi-Fi signal range.

In some embodiments, the access points 406 may be used for in-home or in-building wireless networks (e.g., IEEE 802.11, Bluetooth, ZigBee, any other type of radio frequency-based network protocol and/or variations thereof). Each of the wireless communication devices 402 may include a built-in radio and/or is coupled to a radio. Such wireless communication devices 402 and/or access points 406 may operate in accordance with the various aspects of the disclosure as presented herein to enhance performance, reduce costs and/or size, and/or enhance broadband applications. Each wireless communication devices 402 may have the capacity to function as a client node seeking access to resources (e.g., data, and connection to networked nodes such as servers) via one or more access points.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 4B:
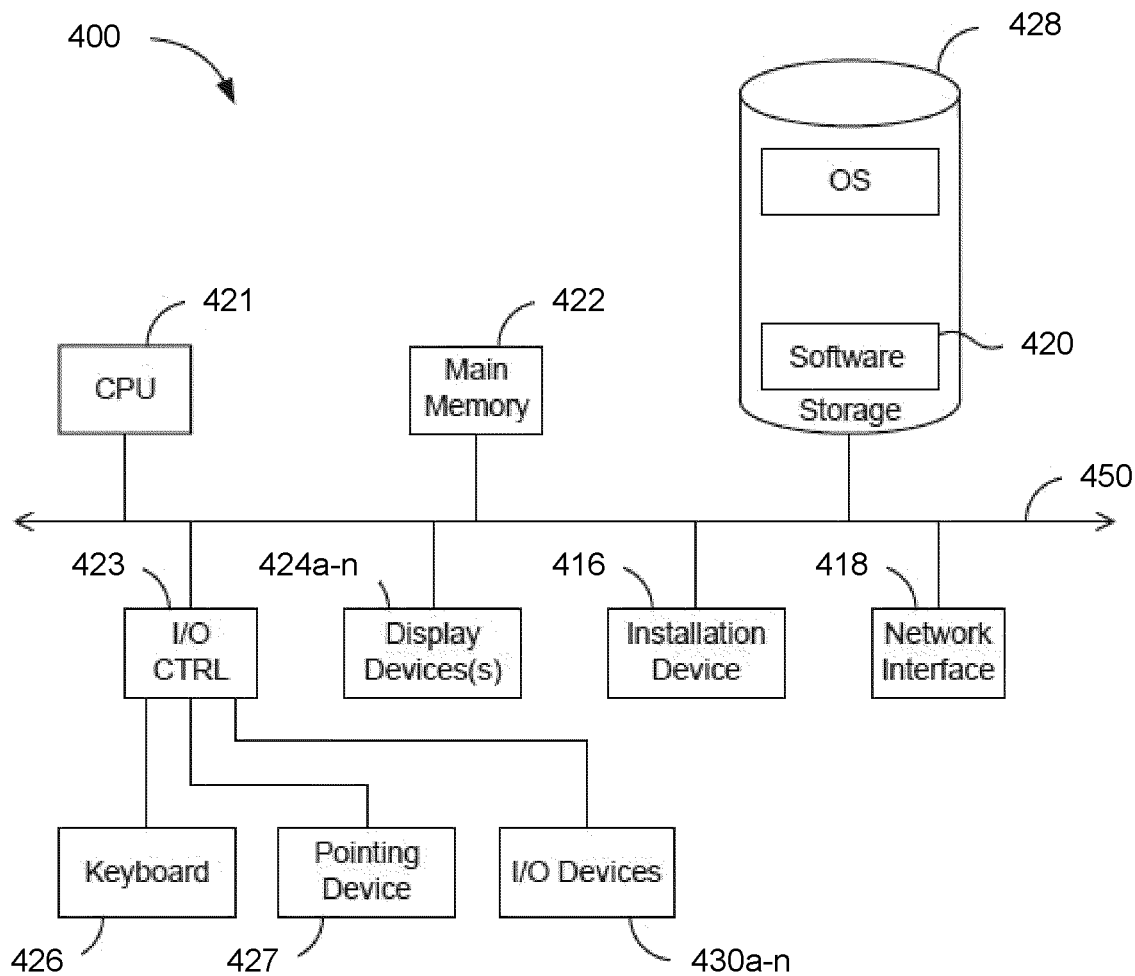
FIGS. 4B and 4C are block diagrams depicting embodiments of computing devices useful in connection with the methods and systems described herein.
Figure 4C:
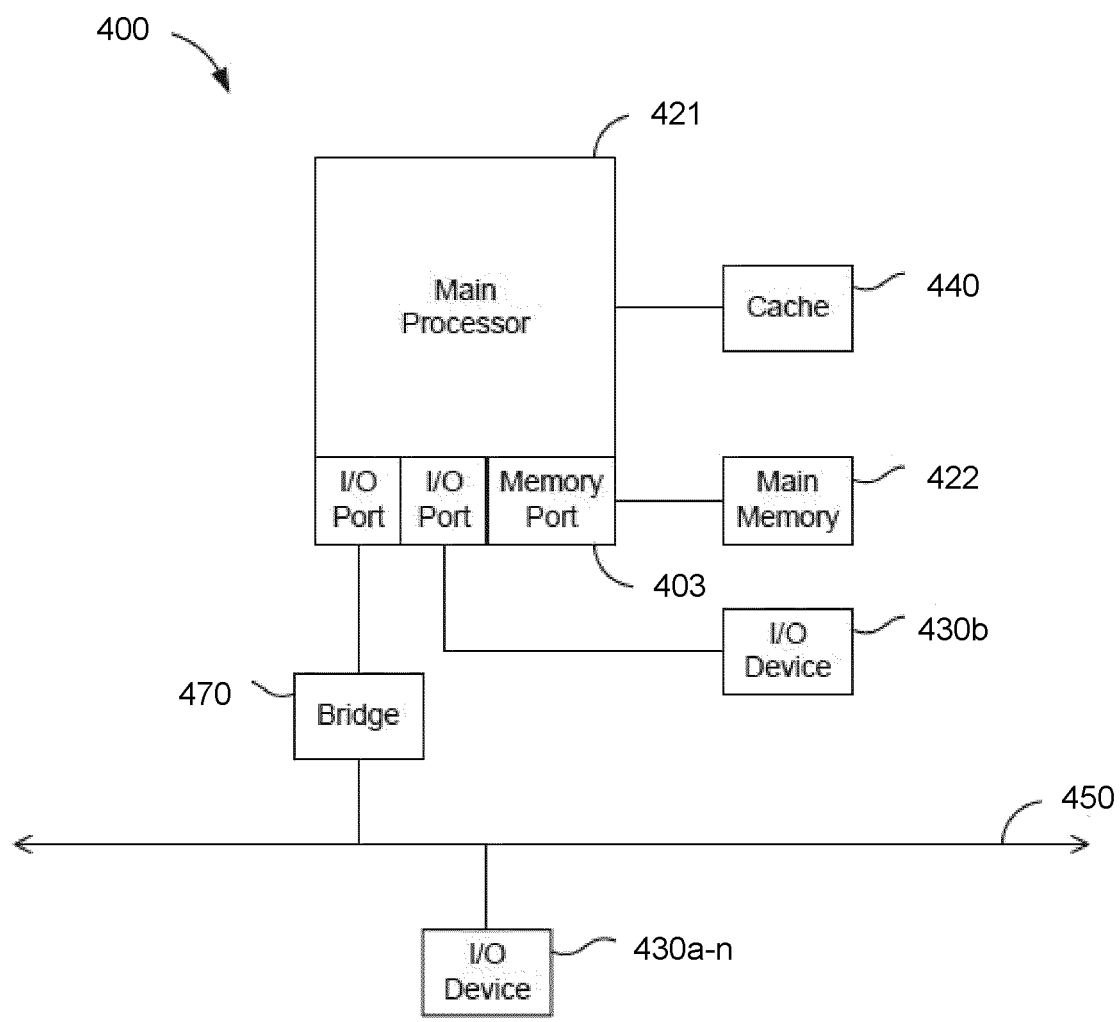

The communications device(s) 402 and access point(s) 406 may be deployed as and/or executed on any type and form of computing device, such as a computer, network device, or appliance capable of communicating on any type and form of network and performing the operations described herein. FIGS. 4B and 4C depict block diagrams of a computing device 400 useful for practicing an embodiment of the wireless communication device 402 or access point 406. As shown in FIGS. 4B and 4C, each computing device 400 includes a central processing unit 421, and a main memory unit 422. As shown in FIG. 4B, a computing device 400 may include a storage device 428, an installation device 416, a network interface 418, an I/O controller 423, display devices 424a-401n, a keyboard 426 and a pointing device 427, such as a mouse. The storage device 428 may include, without limitation, an operating system and/or software. As shown in FIG. 4C, each computing device 400 may also include additional optional elements, such as a memory port 403, a bridge 470, one or more input/output devices 430a-430n (generally referred to using reference numeral 430), and a cache memory 440 in communication with the central processing unit 421.

The central processing unit 421 is any logic circuitry that responds to and processes instructions fetched from the main memory unit 422. In many embodiments, the central processing unit 421 is provided by a microprocessor unit, such as: those manufactured by Intel Corporation of Mountain View, California; those manufactured by International Business Machines of White Plains, New York; or those manufactured by Advanced Micro Devices of Sunnyvale, California. The computing device 400 may be based on any of these processors, or any other processor capable of operating as described herein.

Main memory unit 422 may be one or more memory chips capable of storing data and allowing any storage location to be accessed by the microprocessor 421, such as any type or variant of Static random-access memory (SRAM), Dynamic random-access memory (DRAM), Ferroelectric RAM (FRAM), NAND Flash, NOR Flash and Solid-State Drives (SSD). The main memory 422 may be based on any of the above-described memory chips, or any other available memory chips capable of operating as described herein. In the embodiment shown in FIG. 1B, the processor 421 communicates with main memory 422 via a system bus 450 (described in more detail below). FIG. 4C depicts an embodiment of a computing device 400 in which the processor communicates directly with main memory 422 via a memory port 403. For example, in FIG. 4C the main memory 422 may be DRAM.

FIG. 4C depicts an embodiment in which the main processor 421 communicates directly with cache memory 440 via a secondary bus, sometimes referred to as a backside bus. In other embodiments, the main processor 421 communicates with cache memory 440 using the system bus 450. Cache memory 440 typically has a faster response time than main memory 422 and is provided by, for example, SRAM, BSRAM, or EDRAM. In the embodiment shown in FIG. 4C, the processor 421 communicates with various I/O devices 430 via a local system bus 450. Various buses may be used to connect the central processing unit 421 to any of the I/O devices 430, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 424, the processor 421 may use an Advanced Graphics Port (AGP) to communicate with the display 424. FIG. 1C depicts an embodiment of a computer or computer system 400 in which the main processor 421 may communicate directly with I/O device 430b, for example via HYPERTRANSPORT, RAPIDIO, or INFINIBAND communications technology. FIG. 4C also depicts an embodiment in which local busses and direct communication are mixed: the processor 421 communicates with I/O device 430a using a local interconnect bus while communicating with I/O device 430b directly.

A wide variety of I/O devices 430a-430n may be present in the computing device 400. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 423 as shown in FIG. 4B. The I/O controller may control one or more I/O devices such as a keyboard 426 and a pointing device 427, e.g., a mouse or optical pen. Furthermore, an I/O device may also provide storage and/or an installation medium 416 for the computing device 400. In still other embodiments, the computing device 400 may provide USB connections (not shown) to receive handheld USB storage devices such as the USB Flash Drive line of devices manufactured by Twintech Industry, Inc. of Los Alamitos, California.

Referring again to FIG. 4B, the computing device 400 may support any suitable installation device 416, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 400 may further include a storage device, such as one or more hard disk drives or redundant arrays of independent disks, for storing an operating system and other related software, and for storing application software programs such as any program or software 420 for implementing (e.g., software 420 configured and/or designed for) the systems and methods described herein.

Optionally, any of the installation devices 416 could also be used as the storage device. Additionally, the operating system and the software can be run from a bootable medium.

Furthermore, the computing device 400 may include a network interface 418 to interface to the network 404 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 400 communicates with other computing devices 400' via any type and/or form of gateway or tunneling protocol such as Secure Socket Layer (SSL) or Transport Layer Security (TLS). The network interface 418 may include a built-in network adapter, network interface card, PCMCIA network card, card bus network adapter, wireless network adapter, USB network adapter, modem or any other device suitable for interfacing the computing device 400 to any type of network capable of communication and performing the operations described herein.

In some embodiments, the computing device 400 may include or be connected to one or more display devices 424a-424n. As such, any of the I/O devices 430a-430n and/or the I/O controller 423 may include any type and/or form of suitable hardware, software, or combination of hardware and software to support, enable or provide for the connection and use of the display device(s) 424a-424n by the computing device 400. For example, the computing device 400 may include any type and/or form of video adapter, video card, driver, and/or library to interface, communicate, connect or otherwise use the display device(s) 424a-424n. In one embodiment, a video adapter may include multiple connectors to interface to the display device(s) 424a-424n. In other embodiments, the computing device 400 may include multiple video adapters, with each video adapter connected to the display device(s) 424a-424n. In some embodiments, any portion of the operating system of the computing device 400 may be configured for using multiple displays 424a-424n. One ordinarily skilled in the art will recognize and appreciate the various ways and embodiments that a computing device 400 may be configured to have one or more display devices 424a-424n.

In further embodiments, an I/O device 430 may be a bridge between the system bus 450 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device or system 400 of the sort depicted in FIGS. 4B and 4C may operate under the control of an operating system, which controls scheduling of tasks and access to system resources. The computing device 400 can be running any operating system such as any of the versions of the MICROSOFT WINDOWS operating systems, the different releases of the Unix and Linux operating systems, any version of the MAC OS for Apple computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 400 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 400 has sufficient processor power and memory capacity to perform the operations described herein.

In some embodiments, the computing device 400 may have different processors, operating systems, and input devices consistent with the device. For example, in one embodiment, the computing device 400 is a smart phone, mobile device, tablet or personal digital assistant. In still other embodiments, the computing device 400 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 400 can be any workstation, desktop computer, laptop or notebook computer, server, handheld computer, mobile telephone, any other computer, or other form of computing or telecommunications device that is capable of communication and that has sufficient processor power and memory capacity to perform the operations described herein. Aspects of the operating environments and components described above will become apparent in the context of the systems and methods disclosed herein.

It should be noted that certain passages of this disclosure can reference terms such as "first" and "second" in connection with devices signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a floppy disk, a hard disk, a CD-ROM, a flash memory card, a PROM, a RAM, a ROM, ASIC, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above-described embodiments, methods, and examples, but by all embodiments and methods within the scope and spirit of the disclosure.

What is claimed is:

1. A device, receiving an input signal and providing an output signal, the device comprising:
   a first circuit receiving an input signal having a first frequency, the first circuit including a first node and a second node;
   a second circuit receiving an input signal having a second frequency different from the first frequency, the second circuit including a first node and a second node; a first inductor coupled between the first node of the first circuit and the first node of the second circuit;
   a second inductor coupled between the second node of the first circuit and the second node of the second circuit; and
   a first transistor between the first node of the second circuit and the second node of the second circuit operating as a first switch that, upon activation responsive to a control signal corresponding to a high-speed path, operates in a closed state to electrically couple the first node of the second circuit and the second node of the second circuit, the first transistor coupled to a plurality of transistors that are electrically coupled between a power source and a drain or source node of the first transistor and operate in the closed state with the first transistor in the high-speed path.

2. The device of claim 1, further comprising:
   at least one differential inductor formed of the first inductor and the second inductor in response to the first switch being in the closed state, wherein the device outputs a resonant clock signal.

3. The device of claim 1, further comprising:
   the first circuit transmitting a signal corresponding to the input signal received by
   the first circuit to an output of the device in response to the first switch being in the closed state, wherein the device outputs a resonant clock signal.

4. The device of claim 1, further comprising:
   the first inductor being decoupled from the second inductor in response to the first switch being in an open state, wherein the device outputs a CMOS clock signal.

5. The device of claim 4, further comprising:
   the first inductor being in series with at least partial capacitance of the first circuit and at least partial capacitance of the second circuit in response to the first switch being in an open state; and
   the second inductor being in series with at least partial capacitance of the first circuit and at least partial capacitance of the second circuit in response to the first switch being in the open state,
   wherein the device outputs the CMOS clock signal.

6. The device of claim 1, further comprising:
   the second circuit transmitting a signal corresponding to the input signal received by the second circuit to an output of the device in response to the first switch being in an open state, wherein the device outputs a CMOS clock signal.

7. The device of claim 1, wherein the first frequency is higher than the second frequency.

8. The device of claim 1, wherein a first pair of transistors of the plurality of transistors, coupled to the first transistor, drive the first node of the second circuit and a second pair of transistors of the plurality of transistors, coupled to the first transistor, drive the second node of the second circuit.

9. The device of claim 1, wherein the device is configured to be programmable by a user to set at least one of the first frequency and the second frequency.

10. A system, receiving an input signal and providing an output signal, the system comprising:
    a device comprising a first circuit and a second circuit, wherein the device is configured to:
    receive, by the first circuit, an input signal having a first frequency, the first circuit including a first node and a second node;
    receive, by the second circuit, an input signal having a second frequency different from the first frequency, the second circuit including a first node and a second node; and
    output, by the device, the output signal corresponding to the first frequency or the second frequency,
    wherein a first inductor is coupled between the first node of the first circuit and the first node of the second circuit, and
    wherein a second inductor is coupled between the second node of the first circuit and the second node of the second circuit, and
    operate a first transistor between the first node of the second circuit and the second node of the second circuit as a first switch that, upon activation responsive to a control signal corresponding to a high-speed path, operates in a closed state to electrically couple the first node of the second circuit and the second node of the second circuit, the first transistor coupled to a plurality of transistors that are electrically coupled between a power source and a drain or source node of the first transistor and operate in the closed state with the first transistor in the high-speed path.

11. The system of claim 10, wherein the device is further configured to:
    form at least one differential inductor of the first inductor and the second inductor in response to the first switch being in the closed state,
    wherein the system outputs a resonant clock signal.

12. The system of claim 10 wherein the device is further configured to:
    receive, by the first circuit, the input signal having the first frequency; and
    transmit, by the first circuit, a signal corresponding to the input signal having the first frequency to an output of the device in response to the first switch being in the closed state, wherein the system outputs a resonant clock signal.

13. The system of claim 10, wherein the device is further configured to:
    decouple the first inductor from the second inductor in response to the first switch being in an open state, wherein the system outputs a CMOS clock signal.

14. The system of claim 13, wherein the device is further configured to:
    couple in series the first inductor with at least partial capacitance of the first circuit and at least partial capacitance of the second circuit in response to the first switch being in an open state; and couple in series the second inductor with at least partial capacitance of the first circuit and at least partial capacitance of the second circuit in response to the first switch being in the open state, wherein the system outputs the CMOS clock signal.

15. The system of claim 10, wherein the device is further configured to:
receive, by the second circuit, the input signal having the first frequency;
transmit, by the second circuit, a signal corresponding to the input signal having the first frequency to an output of the device in response to the first switch being in an open state,
wherein the system outputs a CMOS clock signal.

16. The system of claim 10, wherein the device is further configured to be programmable by a user setting at least one of the first frequency or the second frequency.

17. A method of controlling a device, the method comprising:
receiving, by a first circuit, an input signal having a first frequency, the first circuit including a first node and a second node;
receiving, by a second circuit, an input signal having a second frequency different from the first frequency, the second circuit including a first node and a second node; and
outputting, by the device, an output signal corresponding to the first frequency or the second frequency,
wherein a first inductor is coupled between the first node of the first circuit and the first node of the second circuit, wherein a second inductor is coupled between the second node of the first circuit and the second node of the second circuit; and
operating a first transistor between the first node of the second circuit and the second node of the second circuit as a first switch that, upon activation responsive to a control signal corresponding to a high-speed path, operates in a closed state to electrically couple the first node of the second circuit and the second node of the second circuit, the first transistor coupled to a plurality of transistors that are electrically coupled between a power source and a drain or source node of the first transistor and operate in the closed state with the first transistor in the high-speed path.

* * * * *